United States Patent [19]
Jen et al.

[11] Patent Number: 5,135,295
[45] Date of Patent: Aug. 4, 1992

[54] FIBER-OPTIC PIEZOELECTRIC DEVICES

[75] Inventors: Cheng-Kuei Jen, Brossard; Michael Sayer; Guanghua Yi, both of Kingston; Jean F. Bussiere, St. Bruno, all of Canada

[73] Assignee: Queen's University at Kingston, Kingston, Canada

[21] Appl. No.: 485,918

[22] Filed: Feb. 27, 1990

[51] Int. Cl.⁵ .................................................. G02B 6/26
[52] U.S. Cl. ........................................ 385/13; 385/128; 385/141
[58] Field of Search ............... 350/96.29, 96.30, 96.31, 350/96.32, 96.33, 96.34; 427/100

[56] References Cited
U.S. PATENT DOCUMENTS

| | | | |
|---|---|---|---|
| 4,056,654 | 11/1977 | Kompanek | 427/100 X |
| 4,330,593 | 5/1982 | Shrout et al. | 427/100 X |
| 4,783,135 | 11/1988 | Utsumi et al. | 350/96.30 |
| 4,792,463 | 12/1988 | Okada et al. | 427/100 X |
| 4,889,400 | 12/1989 | Pinson | 350/96.30 |
| 4,932,749 | 6/1990 | Haidle et al. | 350/96.30 |
| 4,963,390 | 10/1990 | Lipeles et al. | 427/100 X |

Primary Examiner—William L. Sikes
Assistant Examiner—Phan T. Heartney
Attorney, Agent, or Firm—Richard J. Hicks

[57] ABSTRACT

Efficient, simple, miniature and economical piezoelectric and ultrasonic devices employing optical fibers coated with lead-zirconate-titanate (PZT) thin piezoelectric and ferroelectric films are described. The PZT thin films are fabricated chemically by a sol-gel method. Optical fibers can be dipped into the PZT solution, and followed by an annealing and an electric poling process in order to achieve good piezoelectricity in the coated PZT films. This coating process can be devised as an on-line method and thus coating length can be larger than meters. Due to the long coating length, high piezoelectricity, miniature and flexible nature, devices using optical fibers may be used for medical, telecommunication and sensor applications.

10 Claims, 6 Drawing Sheets

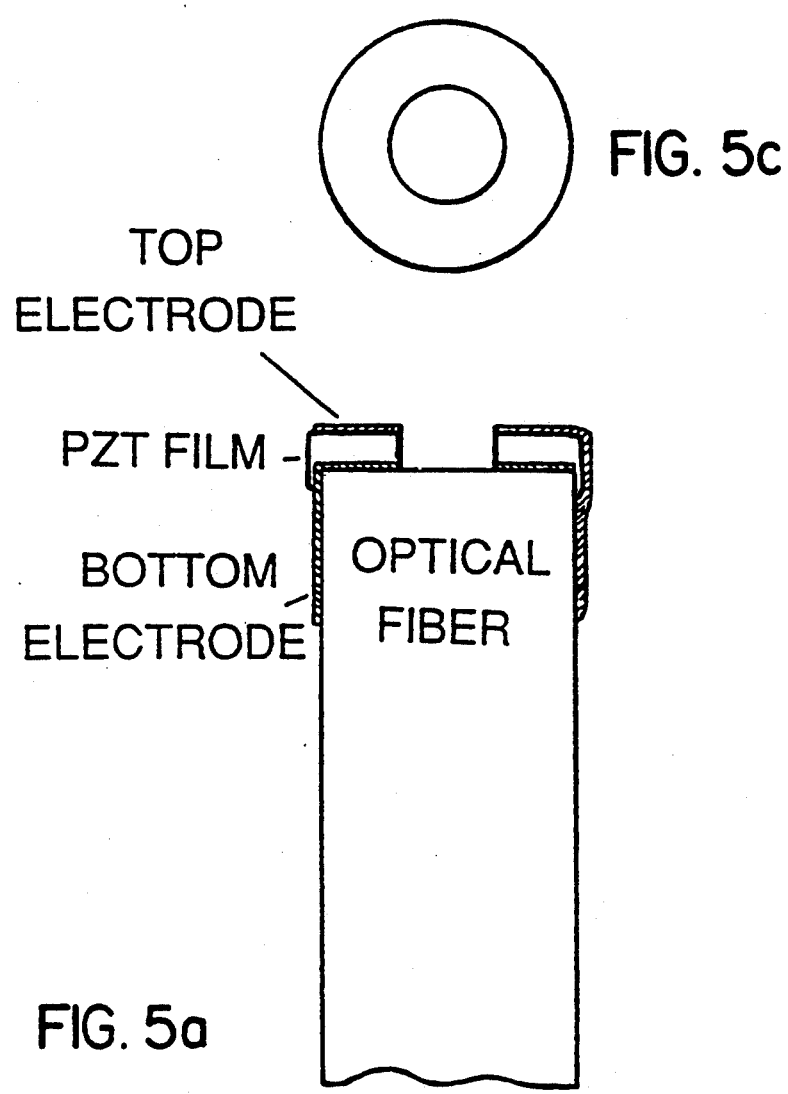
FIG. 5c
FIG. 5a
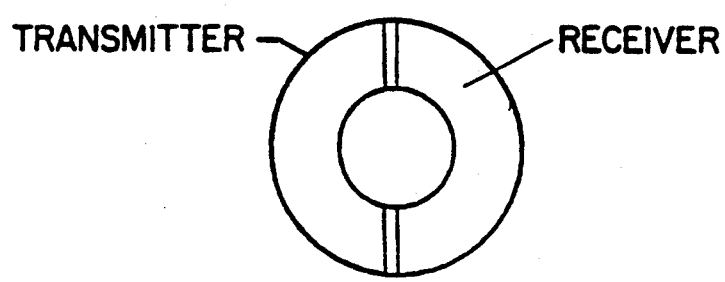
FIG. 5b

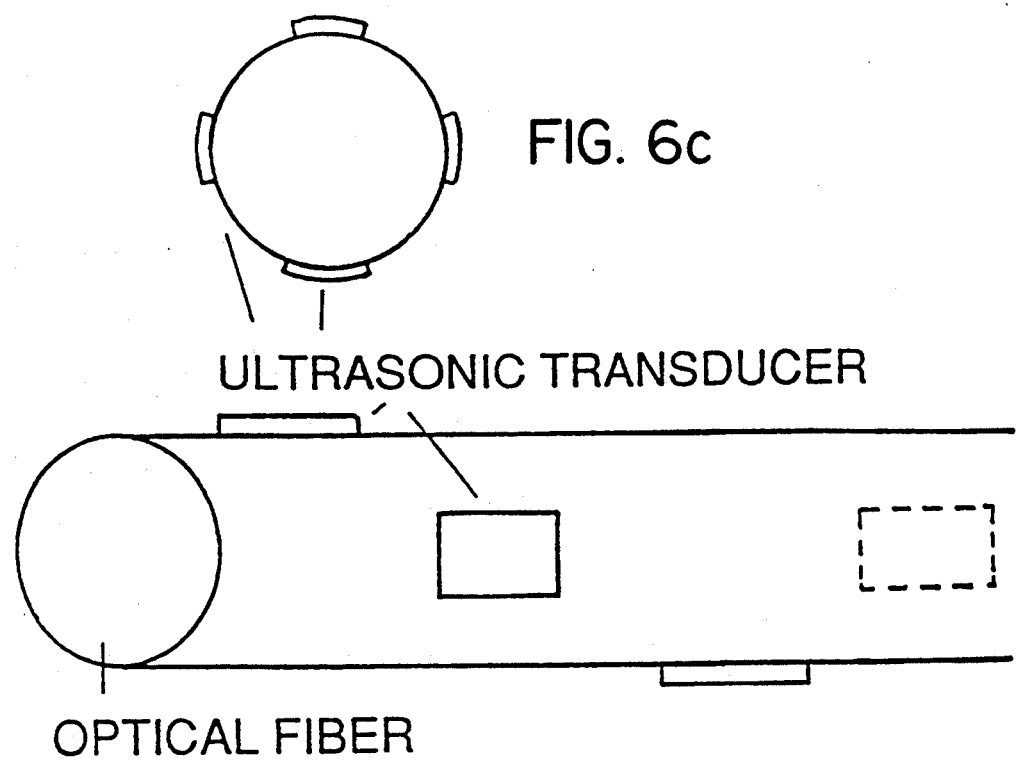
FIG. 6c
FIG. 6a
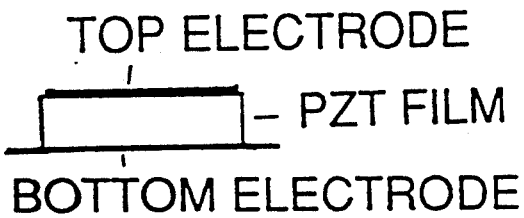
FIG. 6d
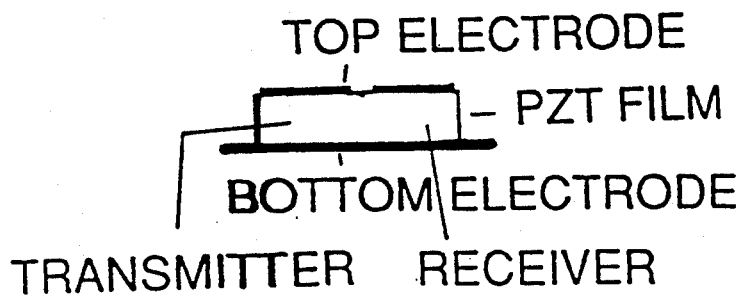
FIG. 6b

FIBER-OPTIC PIEZOELECTRIC DEVICES

CROSS REFERENCE TO RELATED APPLICATION

This invention is related to copending application Ser. No. 343,774, filed 27 April 1989 entitled Sol-Gel Process for Preparing Pb(ZrTi) $O_2$ Thin Films, by Michael Sayer and Guanghua Yi.

FIELD OF INVENTION

This invention relates to optical fibers coated with a layer of chemically prepared lead-zirconate-titanate (PZT) thin piezoelectric and ferroelectric film. More specifically, the invention relates to piezoelectric, acoustic, acousto-optic and electro-optic devices consisting of optical fibers coated with PZT thin films.

BACKGROUND OF THE INVENTION

Recently fiber optic devices have been increasingly used in medical applications because of their flexibility, small diameter, low optical loss and the well developed technologies in optics. Many of them are used for surgical purposes. Due to the stringent concerns of safety especially during the laser surgical conditions in critical parts of the human body such as heart and brain, the information about fiber position and steering ability of the optical fiber tip, and others such as the result of the laser ablation of obstacles which block blood vessels are necessary. Low cost fiber-optic devices which can provide this information are still in high demand.

Many in-line fiber-optic phase compensators, modulators, switches employing piezoelectrics are currently used in optical fiber telecommunication and sensor industries. A layer of piezoelectric polyvinyledene difluoride (PVDF) polymer has been coated along the optical fiber. PVDF polymer has a few major problems; one is the low Curie temperature (85° C. as compared to 300° C. of PZT), low piezoelectric strain constants (e.g. $d_{33}$ is 15 times smaller than that of PZT), low mechanical strength and high acoustic loss. When the temperature of a piezoelectric material is above its Curie temperature, the piezoelectricity disappears even after cooling. Low mechanical and piezoelectric strength of PVDF make this film unusable for steering an optical fiber tip. PVDF is not an efficient high frequency (>10 MHz) transducer material due to its high acoustic attenuation and low piezoelectricity. Since there is a large difference between the acoustic impedance, which is the product of the material density and acoustic velocity, of the PVDF and the glass, it is difficult to achieve a wideband acoustic transducer.

Zinc oxide has been coated on optical fibers with the use of vacuum sputtering techniques. This technique is well known to be very costly, time consuming, and difficult to apply to long coating lengths especially on optical fibers. The piezoelectric strain coefficients of zinc oxide are also very low compared to those of PZT. Since zinc oxide is a crystalline structure, due to the curvature of the fiber the crystals will not be all perpendicular to the surface. Because of this tilted crystal orientation both desired longitudinal and unwanted shear acoustic waves will be excited. The signal to noise ratio for example in a broadband phase modulator is limited. Zinc oxide is a piezoelectric but not a ferroelectric material. This means that the sign of the piezoelectric strain coefficients can not be changed by external influence after the growth of the film. For bending the optical fiber it is preferred to have the freedom to change the sign of such coefficients.

Therefore, optical fiber devices equipped with mechanical flexibility and strength, miniature size, high efficiency and with low cost are still in large demand.

OBJECT OF THE INVENTION

It is therefore an object of the present invention to provide fiber-optic devices coated with a piezoelectric and ferroelectric lead-zirconate-titanate film.

It is a further object of the present invention to provide piezoelectric, acoustic, acousto-optic and electro-optic fiber-optic devices coated with piezoelectric and ferroelectric lead-zirconate-titanate films.

SUMMARY OF THE INVENTION

Optical fibers have been successfully coated with a thin layer of PZT ceramic. This PZT film is piezoelectric, ferroelectric and macroscopically amorphorous material. PZT coated fibers can be used as low frequency acoustic vibrators. They can also be connected together with a d.c. power supply to electronically steer the optical fiber tip. Miniature ultrasonic transducers at the tip and periphery of optical fibers can be fabricated as well. These small ultrasonic transducers can provide information on fiber position and the result of laser ablation during surgery. Since the optical fiber can probe inside blood vessels, the above functions can be very useful for medical, including surgical, applications.

Stress can be generated by the electric field applied to the piezoelectric PZT coating. This stress may change the refractive index of the optical fiber within the coating area, or excite acoustic waves which will affect the guided optical waves in the fiber. The piezoelectrical coating can be also used to stretch or compress the fiber, thus changing the effective optical propagation path length and hence the phase. Therefore optical fiber devices providing phase modulation and frequency shifting can be fabricated. These devices are particularly useful for optical fiber interferometers.

Thus by one aspect of the invention there is provided a piezoelectric device comprising an optical fiber substrate having deposited thereon, in sequence, a buffer layer, PZT layer and a conductive layer.

By another aspect of the invention there is provided a piezoelectric device comprising an optical fiber substrate having deposited thereon, in sequence, a buffer layer, PZT layer and a conductive layer wherein said conductive layer comprises separate layers on opposite sides of said device arranged so that application of a d.c. electric field in opposite directions in respective ones of said layers results in bending of said optical fiber.

BRIEF DESCRIPTION OF THE DRAWINGS

For a more complete understanding of the present invention and for further objects and advantages thereof, reference may be made to the following description taken in conjunction with the accompanying drawing in which:

FIGS. 5(a), 5(b) and 5(c) show fiber-optic acoustic devices according to still another embodiment of the invention. (a) and (b) have different acoustic transducer geometries. FIG. 5(c) is a plan view of the transducer of FIG. 5(a).

FIGS. 6(a), 6(b), 6(c) and 6(d) show fiber-optic acoustic devices according to still another embodiment of the invention. (a) and (b) have different acoustic transducer geometries. FIG. 6(c) is a side view of the embodiment of FIG. 6(a), FIG 6(b) is a side view of the embodiment of FIG. 5(b) while FIG. 6(d) is a side view of the embodiment of FIG. 5(c).

DETAILED DESCRIPTION OF PREFERRED EMBODIMENTS OF THE INVENTION

Figure 1:
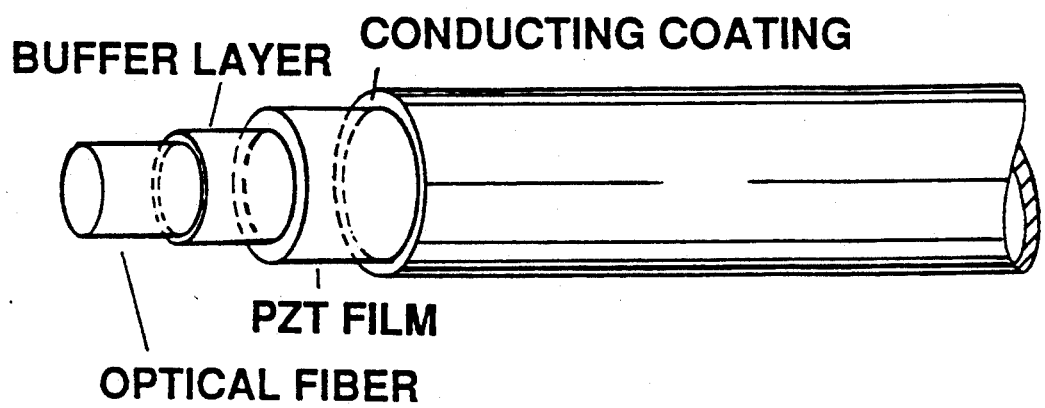
FIG. 1 shows a fiber-optic device according to one embodiment of the invention.

FIG. 1 illustrates a basic geometry according to preferred embodiments of the present invention. This invention consists of an optical fiber coated with three layers of coating; first, a buffer layer; second, a layer of PZT thin film; and third, a layer of conductive thin film. The buffer layer can be an insulator such as alumina or sapphire, or a conductor such as aluminum, gold, nickel or other conductive material having a melting point higher than 500° C. The outer conductive coating does not require a high melting point. The optical fiber can be single mode or multimode, and made of a glass or a single crystal such as lithium niobate or sapphire. It can also be glass fibers with twin cores and common cladding.

PZT is fabricated by a sol-gel method described in more detail in the aforesaid U.S. patent application Ser. No. 343,774 and summarized as follows:

1. Dissolve lead acetate $Pb(CH_3COO)_2.3H_2O$ in acetic acid $CH_3COOH$ at 80° C.
2. Dehydrate the above solution at 105° C. and then cool to 80° C.
3. Add Zirconium propoxide $Zr(C_3H_7O)_4$
4. Add titanium propoxide $Ti[(CH_3)_2CHO]_4$
5. Mix the resulting solution in an ultrasonic bath
6. Add ethylene glycol and water to form stock solution.

This solution is referred to as solution P-Z-T. The optical fiber in FIG. 1, coated with a buffer layer, is dipped into the solution P-Z-T and removed. The main function of the buffer layer is to use its thermal and mechanical properties to elimate or reduce the cracking of the PZT film. The thickness of the solution P-Z-T coating is controlled by the viscosity of this solution which can be adjusted by adding different amounts of ethylene glycol and water. The P-Z-T coated optical fiber is then fired at 300° to 500° C. This coating and firing can be repeated several times until the desired thickness is obtained, then it is annealed at 600° C. for at least two hours. The coating now on the optical fiber is truly a PZT film. Another layer of conductive coating is coated on top of the PZT layer. The PZT coating fabricated by sol-gel process is relatively cheap and long coating lengths can be achieved much more easily than the vacuum sputtering techniques commonly used to produce zinc oxide.

Figure 2A:
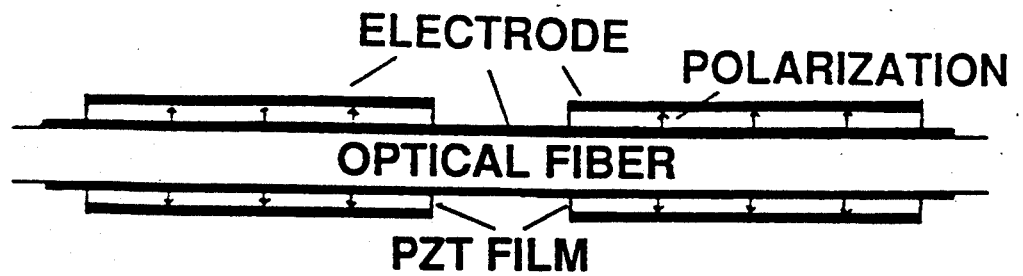
FIGS. 2(a) and 2(b) show different electric polarization states of PZT film after different radial electric poling processing.
Figure 2B:
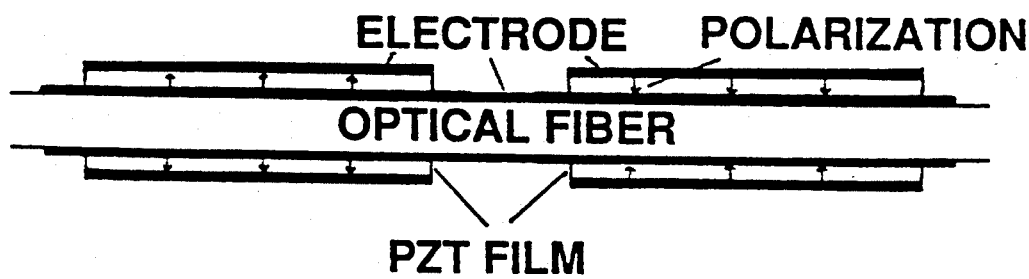
Figure 3:
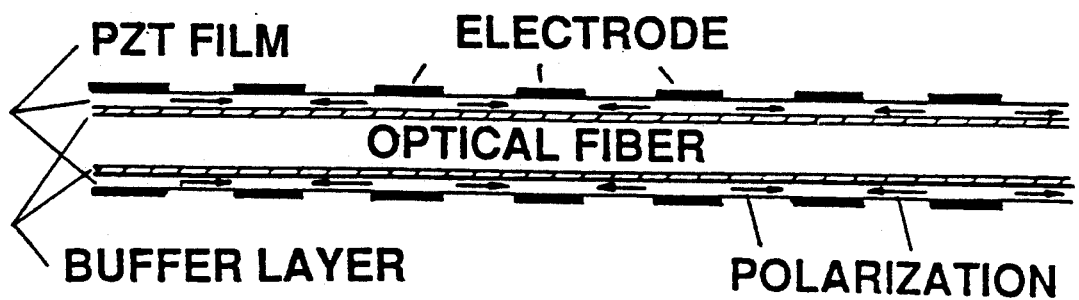
FIG. 3 show the electric polarization state of PZT film after axial electric poling.

If the buffer layer is also a conducting coating, by applying a d.c. voltage across the two conductive electrodes sandwiching the PZT layer at 170° C. for about 10 minutes, the PZT becomes piezoelectric. The polarization direction of the electric dipole is parallel to the direction of the applied electric field during electric poling. The poling can be achieved radially or axially as shown in FIGS. 2 and 3 respectively. In FIGS. 2 and 3 the poling electric field is across electrode a and c or b and c. The difference between FIG. 2(a) and 2(b) is that the poling field between a and c is the reverse of that between b and c. This poling to achieve piezoelectricity is a unique characteristic of a ferroelectric material. It is an advantage over the non-ferroelectric zinc oxide film.

Figure 4A:
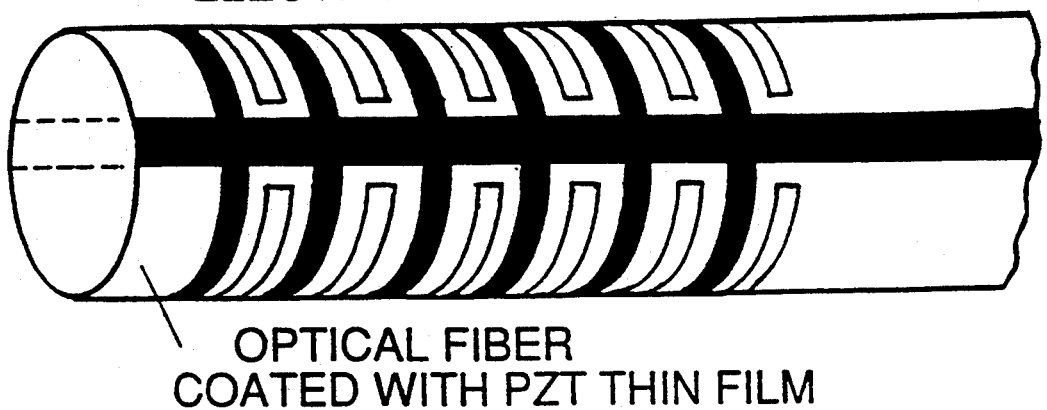
FIGS. 4(a) and 4(b) show fiber-optic piezoelectric, acousto-optic and electro-optic devices according to still another embodiment of the invention. (a) and (b) have different electrode patterns.
Figure 4B:
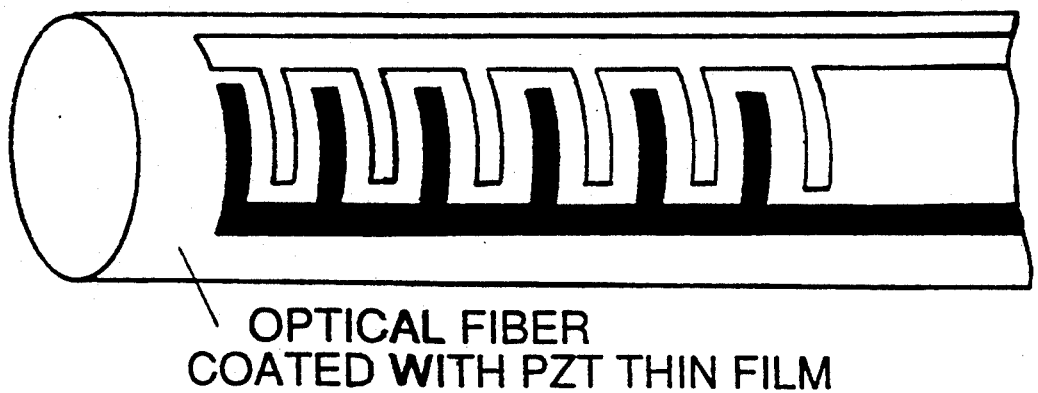

FIGS. 4(a) and 4(b) show another embodiment of this invention. The difference between 4(a) and 4(b) lies in their respective comb-like electrode patterns. The patterns of outer electrodes shown in FIG. 3 are the result of a patterning process applied to the top conducting layer. The patterning can be fabricated by photolithographic or laser patterning techniques. In FIG. 4(a) the comb electrodes cover the entire periphery of the optical fiber, and in 4(b) the electrodes partially cover the periphery.

A d.c. electric field is applied across the two different electrical paths (combs) shown as dark and light electrode regions in FIGS. 4(a). Due to the piezoelectric effect the optical fiber will expand or contract depending upon whether the direction of d.c. electric field is the same as or opposed to the direction of the electric polarization of the PZT film shown in FIGS. 2 and 3. This dimensional change is in the radial direction in FIG. 2 and in the axial direction in FIG. 3.

If the two ends of the PZT coated optical fiber in FIGS. 2(a) and 2(b) are fixed, and a low frequency (<10 MHz) a.c. voltage is applied across the electrodes a and c, and also b and c, the fibers will vibrate like a resonator. If the electric fields applied between the electrodes in FIG. 2 (a) and 2(b) are identical, the resonator frequencies for these two geometries will be different. This different polarization feature can be used to achieve more flexible and accurate control of the vibrating frequency.

In FIG. 3 the amount of extension and contraction is roughly proportional to the product of the piezoelectric strain coefficients of the PZT, the amplitude of the applied voltage and number of comb electrodes. Therefore the optical fiber length can be effectively changed by a small amount which leads to a phase shift for the guided optical waves inside the optical fiber. Since the coating length of PZT can be meters, the phase shift can be adjusted to a large extent. For the geometry of FIG. 3 axial poling is preferred. This is also a distinct advantage of ferroelectric PZT over non-ferroelectric zinc oxide.

Two comb electrode patterns shown in FIG. 4(b) for the top conductive coating can be provided on opposite sides of the optical fiber. If the directions of the d.c. electric field applied across the two combs at these two opposite sides are opposite, the optical fiber will bend due to expansion on one side and contraction on the opposite side. In general, these comb patterns are preferred near the tip of the fiber. Three or four comb electrode patterns can be provided around the optical fiber periphery so that more degrees of freedom for the optical fiber tip bending movement can be obtained. The embodiment shown in FIG. 4(b) is then a fiber-optic piezoelectric device.

In FIG. 1, if the buffer layer is a conducting electrode, and an a.c. field with a frequency close to the resonant frequency of PZT film is applied between the bottom electrode and other electrode, acoustic waves will be efficiently generated and propagated along the radial direction of the fiber. The acoustic waves will produce a refractive index grading along the fiber, and therefore change the phase of the propagating optical waves inside the fiber, so that the embodiment shown in FIG. 1 is then an in-line fiber-optic acousto-optic device. FIGS. 5(a), 5(b) and 5(c) show still another embodiment of the invention. A PZT thin film, fabricated by the sol-gel method, is provided at the tip of the optical fiber and sandwiched by top and bottom electrodes. The fabrication process is the same as that used to produce the device shown in FIG. 1. With this particular sol-gel fabrication process for PZT layers, miniature ultrasonic transducers consisting of a PZT layer sandwiched by top and bottom electrodes at the fiber tip can be produced. This miniature ultrasonic transducer can be used in the pulse-echo mode to perform ranging measurements, for instance, during laser surgical operations inside a human body. In FIGS. 5(a) and 5(c) the transducer is used both as an ultrasonic transmitter and receiver. In FIG. 5(b) the tranducer in 5(a) is physically split in two halves. There is no electrical connection between these two halves. One half is used as the ultrasonic transmitter and other half as the receiver. The geometry in FIG. 5(b) is preferred due to high acoustic signal to noise ratio. Miniature transducers fabricated using sol-gel processed PZT on curved surfaces can excite only the desired longitudinal acoustic waves and keep the unwanted shear waves to a minimum over a broad frequency range. Broadband transducers using vacuum sputtered zinc oxide films on curved optical fiber surfaces generally excite both desired longitudinal and unwanted shear waves simultaneously.

FIGS. 6(a), 6(b), 6(c) and 6(d) show still another embodiment of the invention. The miniature ultrasonic transducers are fabricated at the periphery of the optical fiber as shown in FIGS. 6(a) and 6(c). Four individual miniature transducers are located at four different radial directions of the optical fiber. Their locations along the fiber axis direction are separated in order to reduce the acoustic crosstalk between them. FIGS. 6(b) and 6(d) show two different ultrasonic transducer geometries. The upper one shown in FIG. 6(d) is used as both an ultrasonic transmitter and a receiver. The lower one shown in FIG. 6(b) consists of two halves, one half of which is used as the transmitter and the other as the receiver. This embodiment is a fiber-optic acoustic device. It may provide information regarding the radial location of the optical fiber in a blood vessel in a laser surgical operations with the use of an ultrasonic pulse-echo technique.

Figure 7A:
FIG. 7(a) and 7(b) show two different types of acoustic transducer geometry which can be used in FIG. 4(a).
Figure 7B:
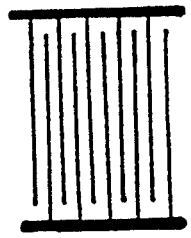

FIGS. 7(a) and 7(b) shown two different patterns for a different ultrasonic transducer, referred to as an interdigital transducer (IDT), which can be used to replace those mentioned in FIG. 6(b). In FIG. 7 one IDT is used as the transmitter and the other as the receiver. This IDT tranducer generates surface acoustic waves (SAW) along the optical fiber. when it is immersed in a liquid such as blood, these SAW will lose their energy and convert to longitudinal waves in the liquid. If the longitudinal wave is reflected back by a reflector such as the wall of blood vessel, the IDT receiver will convert this longitudinal wave back to a SAW and produces an electrical signal. This process is very similar to the ultrasonic pulse-echo method.

It will be appreciated that while this invention has been illustrated by reference to clad glass optical fibers, the techniques of the present invention are also applicable to single crystal clad fibers and to glass fibers with twin cores and common cladding. Other variations within the scope of the invention, as defined by the appended claims, will readily suggest themselves to those skilled in the art.

We claim:

1. A piezoelectric device comprising an optical fiber substrate having deposited thereon and surrounding said optical fiber, in sequence, a buffer layer, PZT layer and a conductive layer.

2. A piezoelectric device as claimed in claim 1 wherein said PZT layer is a sol-gel deposited thin film.

3. A piezoelectric device as claimed in claim 2 wherein said buffer layer is an insulating layer.

4. A piezoelectric device as claimed in claim 3 wherein said insulating layer is selected from alumina and sapphire.

5. A piezoelectric device as claimed in claim 2 wherein said buffer layer is a conducting layer.

6. A piezoelectric device as claimed in claim 5 wherein said conducting layer has a melting point in excess of 500° C.

7. A piezoelectric device as claimed in claim 6 wherein said conducting layer is selected from aluminum, gold and nickel.

8. A piezoelectric device as claimed in claim 1 wherein said optical fiber is selected from the group consisting of glass and single crystal fibers operable in one of single mode and multi mode.

9. A piezoelectric device as claimed in claim 2 wherein said conductive layer comprises separate layers on opposite sides of said device arranged so that application of a d.c. electric field in opposite direction in respective ones of said layers results in bending of said optical fiber.

10. A piezoelectric device as claimed in claim 9 wherein said conductive layers are arranged in comb patterns.

* * * * *